(12) United States Patent
Hung

(10) Patent No.: US 7,312,102 B2
(45) Date of Patent: Dec. 25, 2007

(54) BRIDGE CONNECTION TYPE OF CHIP PACKAGE AND FABRICATING METHOD THEREOF

(75) Inventor: Chih-Pin Hung, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/904,423

(22) Filed: Nov. 10, 2004

(65) Prior Publication Data

US 2005/0062171 A1 Mar. 24, 2005

Related U.S. Application Data

(62) Division of application No. 10/250,290, filed on Jun. 20, 2003, now Pat. No. 6,833,610.

(30) Foreign Application Priority Data

Oct. 7, 2002 (TW) .............................. 91123066 A

(51) Int. Cl.
*H01L 21/00* (2006.01)
(52) U.S. Cl. .................................................... 438/106
(58) Field of Classification Search ................ 257/686, 257/734–738, 678–691; 438/106–108
See application file for complete search history.

(56) References Cited

U.S. PATENT DOCUMENTS 4,026,759 A * 5/1977 McBride et al. .............. 216/20
5,949,133 A * 9/1999 Wojnarowski ............... 257/668
6,528,351 B1 * 3/2003 Nathan et al. ............... 438/118
6,707,149 B2 * 3/2004 Smith .......................... 257/723
6,759,738 B1 * 7/2004 Fallon et al. ................ 257/690
6,867,486 B2 * 3/2005 Hong .......................... 257/686
6,903,458 B1 * 6/2005 Nathan ........................ 257/737
6,936,923 B2 * 8/2005 Lin et al. ..................... 257/750
6,939,474 B2 * 9/2005 Eldridge et al. .............. 216/11
6,952,049 B1 * 10/2005 Ogawa et al. ............... 257/700
6,956,295 B2 * 10/2005 Kinsman ..................... 257/786
6,967,389 B2 * 11/2005 Infantolino et al. ......... 257/642
2003/0042589 A1 * 3/2003 Hong .......................... 257/686
2003/0059976 A1 * 3/2003 Nathan et al. ............... 438/106
2003/0153119 A1 * 8/2003 Nathan et al. ............... 438/106
2004/0135250 A1 * 7/2004 Hung .......................... 257/738
2005/0236640 A1 * 10/2005 Guenther et al. ............ 257/100

FOREIGN PATENT DOCUMENTS

JP 09148473 A * 6/1997

* cited by examiner

*Primary Examiner*—Nathan W Ha
(74) *Attorney, Agent, or Firm*—Jianq Chyun IP Office

(57) ABSTRACT

A chip package having at least a substrate, a chip and a conductive trace is provided. The substrate has a first surface, a second surface, a cavity and at least one substrate contact all positioned on the first surface of the substrate. The chip has an active surface with at least one chip contact thereon. The chip is accommodated inside the cavity with at least one sidewall having contact with one of the sidewalls of the cavity. The active surface of the chip and the first surface of the substrate are coplanar. The conductive trace runs from the active surface of the chip to the first surface of the substrate so that the chip contact and the substrate contact are electrically connected.

9 Claims, 10 Drawing Sheets

BRIDGE CONNECTION TYPE OF CHIP PACKAGE AND FABRICATING METHOD THEREOF

CROSS-REFERENCE TO RELATED APPLICATION

This application is a divisional of a prior application Ser. No. 10/250,290, filed on Jun. 20, 2003, now U.S. Pat. No. 6,833,610 which claims the priority benefit of Taiwan application serial no. 91123066, filed on Oct. 7, 2002.

BACKGROUND OF THE INVENTION

1. Field of Invention

The present invention relates to a type of chip package and fabricating method. More particularly, the present invention relates to a bridge connection type of chip package and fabricating method thereof for improving electrical performance.

2. Description of Related Art

Accompanying the rapid progress in electronic technologies, more personalized and functionally powerful electronic products are developed. To facilitate use and enhance portability, most electronic products are designed to have a lighter weight and a smaller size. Whether a given electronic product can be miniaturized depends largely on the size of the chip package embedded inside. In general, electrical connections between a silicon chip and a carrier in a chip package can be roughly divided into three major types including wire bonding, tape automated bonding (TAB) or flip chip. The connection between the contact on a chip and the contact on a carrier is made in a few sequential steps using a bonding machine. First, the bonding head of a bonding machine is driven over the contact of a chip. An electric discharge is produced near the tip of the bonding head to melt the end of the wire into a spherical ball. The spherical ball is lowered onto a chip contact to form a bond. Thereafter, the bonding head is raised pulling out additional wire from a wire spool. Finally, ultrasound is applied to melt the other end of the wire while the wire is lowered onto a carrier contact.

FIG. 1 is a cross-sectional view of a chip package having a conventional wire-bonding structure. A package structure 100 having a substrate 120, a chip 160, a plurality of conductive wires 170, an encapsulation 180 and a plurality of solder balls 190 is shown in FIG. 1. The substrate 120 has a first surface 122 and a second surface 124. The substrate 120 has a number of substrate contacts 126, 128 and a die pad 132. The contact 126 and the die pad 132 are formed on the first surface 122 of the substrate 120. The substrate contact 126 surrounds the die pad 132. The substrate contact 128 is formed on the second surface 124 of the substrate 120. The chip 160 has an active surface 162 and a backside 164. The chip 160 has a number of chip contacts 166 all on the active surface 162. The backside 164 of the chip 160 is attached to the die pad 132 of the substrate 120 through an adhesive material 140. The chip 160 and the substrate 120 are electrically connected using conductive wires positioned after a wire bonding process. One end of the conductive wire 170 is bonded to the chip contact 166 while the other end of the conductive wire 170 is bonded to the substrate contact 126. The encapsulation 180 encloses the chip 160, the first surface 122 of the substrate 120 and the conductive wires 170. The solder balls 190 are attached to the substrate contacts 128. Through the solder balls 190, the package 100 is able to connect electrically with an external circuit (not shown).

In the aforementioned package 100, the chip 160 and the substrate 120 are electrically connected through conductive wires 170. Since a conductive wire has a relatively small cross-sectional area and long length, resistant mismatch often results in signal decay. At high-frequency signaling operation, in particular, parasitic induction-capacitance in the wire may result in signal reflection. Furthermore, the small sectional area in the conductive pathway at the junction between the conductive wire 170 and the substrate contact 126 or the chip contact 166 often affects the standard power or ground voltage as well as current that ought to be supplied to the package.

SUMMARY OF THE INVENTION

Accordingly, one object of the present invention is to provide a chip package structure and fabricating method thereof capable of shortening the electrical connections between a chip and a substrate so that electrical performance of the package is improved.

To achieve these and other advantages and in accordance with the purpose of the invention, as embodied and broadly described herein, the invention provides a chip package structure. The package includes a substrate, a silicon chip, at least one conductive trace and a plurality of solder balls. The substrate has a first surface and a second surface. The substrate also has a cavity and at least one substrate contact on the first surface of the substrate. The silicon chip has an active surface with at least one chip contact thereon. The chip is positioned inside the cavity of the substrate. At least one sidewall of the chip is next to one of the sidewalls of the cavity. The active surface of the chip and the first surface of the substrate are on the same level plane. The conductive trace is an extension on the active surface of the chip and the first surface of the substrate for connecting a chip contact and a substrate contact together electrically.

According to one preferred embodiment of this invention, the chip package further includes an encapsulation that encloses the active surface of the chip, the first surface of the substrate and the conductive trace. The chip contact is located near the edge of the chip and the substrate contact is located near the edge of the cavity of the substrate. The chip contact and the substrate contact are close to each other. In addition, the cavity can be designed to have a cross-sectional dimension similar to the chip. Moreover, the material of the conductive trace is, for example, lead-tin alloy, tin, lead-free conductive material or conductive plastics.

This invention also provides a method of forming a bridge connection between a silicon chip and a carrier. The method includes the following steps. First, a carrier and a chip are provided. The carrier has a cavity on one side of the carrier. The chip has an active surface. The chip is placed inside the cavity of the carrier such that the active surface of the chip and the surface of the carrier are flush with each other on the same plane. In addition, one of the sidewalls of the chip is pressed against a sidewall of the cavity. At least one conductive trace that extends from the active surface of the chip to the surface of the carrier is formed so that the chip and the carrier are electrically connected. The carrier can be a substrate, for example.

According to one preferred embodiment of this invention, the conductive trace may be fabricated in one of three ways.

The first method includes depositing solder material onto the active surface of the chip and the surface of the carrier by screen-printing. Thereafter, a solder reflow process is conducted to consolidate the solder material into the conductive trace.

The second method includes forming a patterned mask over the active surface of the chip and the surface of the carrier. The patterned mask has at least one opening that exposes the active surface of the chip and the surface of the carrier. A printing method is used to deposit solder material into the opening of the patterned mask. Thereafter, a solder reflow process is conducted to consolidate the solder material into the conductive trace. Finally, the patterned mask is removed. The patterned mask can either be a photosensitive material or a non-photosensitive material.

The third method includes smearing conductive silver paste onto the chip and the carrier. Thereafter, a baking process is conducted to turn the silver paste into a conductive trace so that the chip and the carrier are electrically connected.

This invention also provides an alternative method of forming a bridge connection between a silicon chip and a carrier. The method includes the following steps. First, a carrier and a chip are provided. The carrier has a cavity on one side of the carrier and at least a contact on the surface of the carrier close to the opening edge of the cavity. The chip also has a chip contact close to the edge of the active surface. The chip is placed inside the cavity of the carrier such that the active surface of the chip and the surface of the carrier are flush with each other on the same plane. In addition, one of the sidewalls of the chip is pressed against a sidewall of the cavity so that the chip contact and the carrier contact not only are adjacent to each other but also join up electrically. The carrier can be a substrate, for example.

In brief, the chip contact on the chip and the substrate contact on the substrate are electrically connected to each other directly or indirectly through a conductive trace. Hence, the transmission path between the chip contact and the substrate contact is shortened and the transmission section is widened. Consequently, transmission impedance and signal decay are reduced. Thus, the package is suitable for high frequency operation because there is considerable reduction in parasitic inductance and capacitance. Moreover, since the substrate contact and the chip contact are in direct contact or through a conductive trace having a relatively large contact area with both the substrate contact and the chip contact, impedance mismatch commonly present in a wire bonding connection can be prevented. Ultimately, electrical performance of the package is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
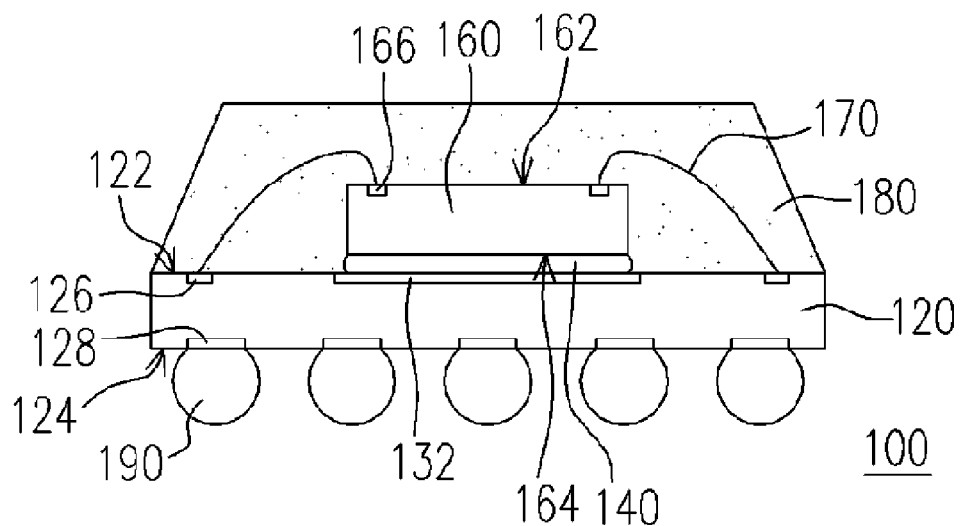
FIG. 1 is a cross-sectional view of a chip package having a conventional wire bond structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
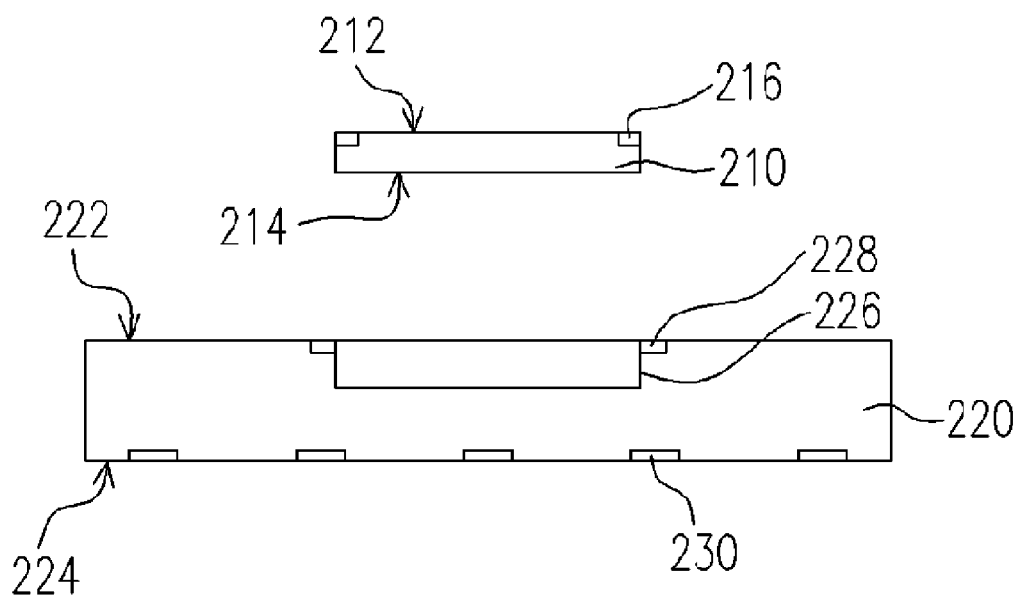
FIGS. 2 to 7 are cross-sectional views showing the progression of steps for fabricating a chip package according to a first preferred embodiment of this invention.
Figure 2A:
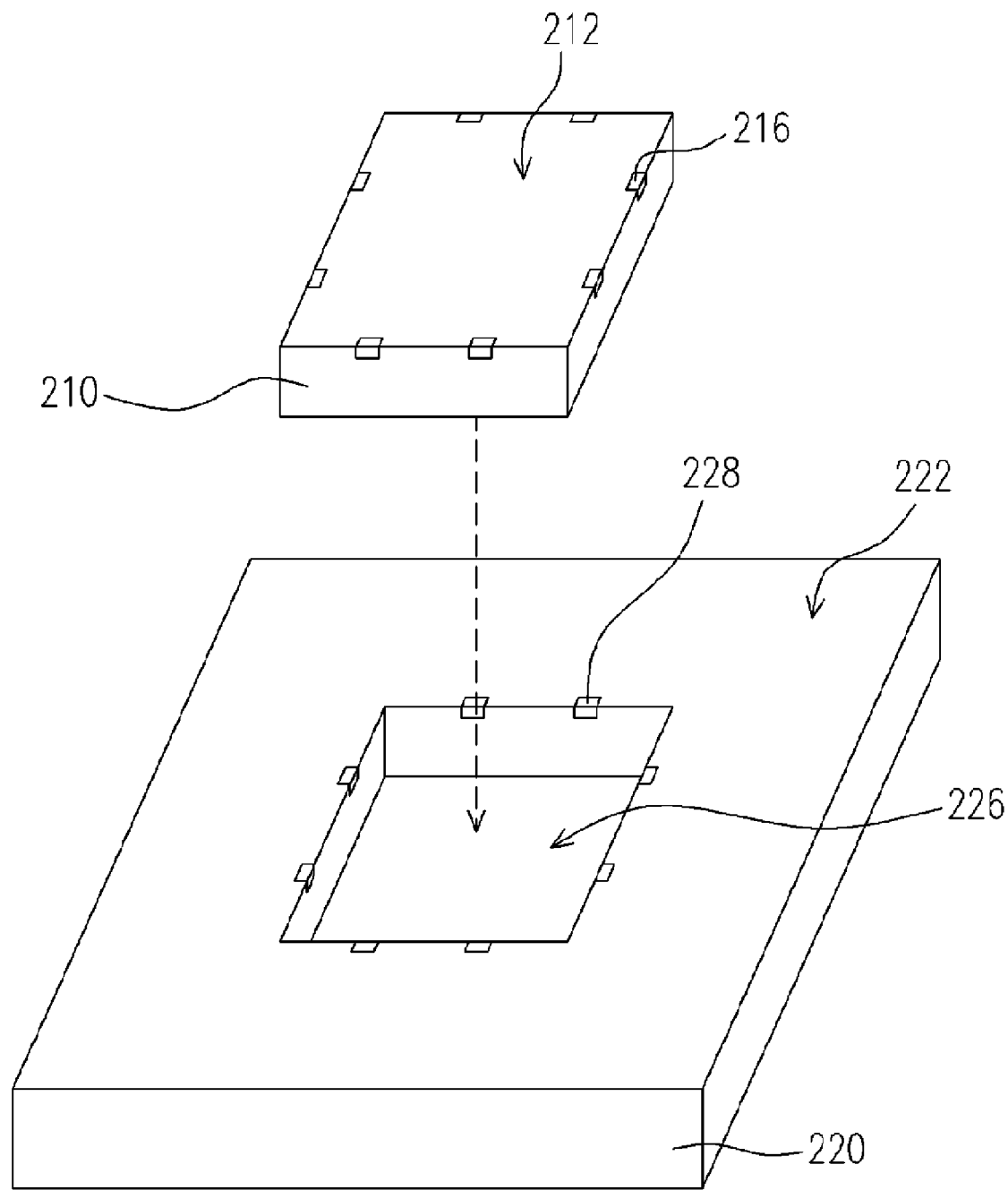
FIG. 2A is a perspective view of the chip and the substrate in FIG. 2.

FIGS. 2 to 7 are cross-sectional views showing the progression of steps for fabricating a chip package according to a first preferred embodiment of this invention. FIG. 2A is a perspective view of the chip and the substrate in FIG. 2. To fabricate a chip package, a chip 210 and a substrate 220 having a first surface 222 and a second surface 224 are provided as shown in FIGS. 2 and 2A. The substrate 226 has cavity 226 and a plurality of substrate contacts 228, 230 on the first surface 222 of the substrate 220. The substrate contacts 228 are on the edges surrounding the cavity 226. That is, the substrate contacts 228 are located next to the opening edges of the cavity 226. The chip 210 has an active surface 212 and a backside 214. The chip 210 also has a plurality of chip contacts 216 positioned around the edges on the active surface 212. In this embodiment, the cavity 226 in the substrate 220 can be designed to have a sectional dimension identical to the chip 210. In addition, the chip contacts 216 and the substrate contacts 228 are located on matching positions.

Figure 3:
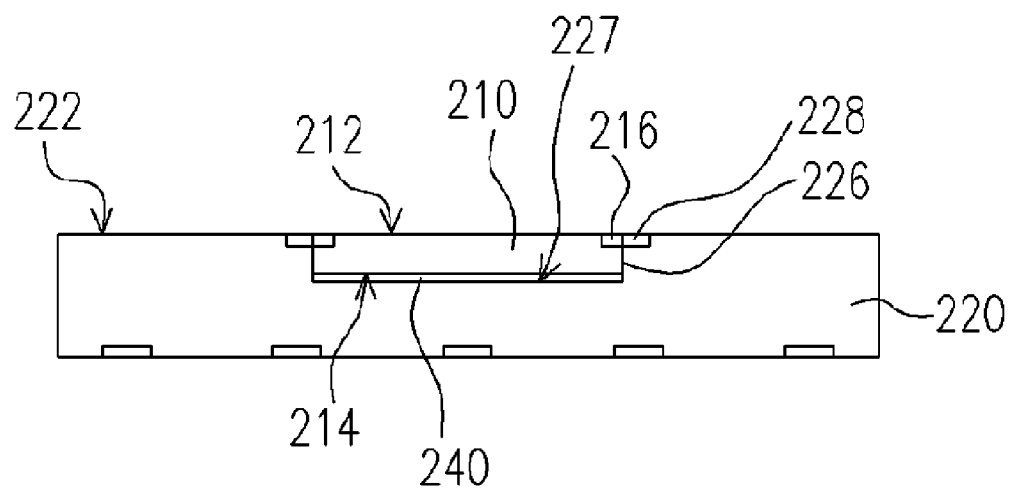

As shown in FIG. 3, the chip 210 is lowered into the cavity 226 of the substrate 220. The backside 214 of the chip 210 is attached to the bottom surface 227 of the cavity 226 using an adhesive material 240, the sidewalls of the chip 210 tightly contacting the sidewalls of the cavity 226. Moreover, the active surface 212 of the chip 210 and the first surface 222 of the substrate 220 are on the same common plane. Hence, the chip contacts 216 are positioned directly next to the substrate contacts 228.

Figure 4:
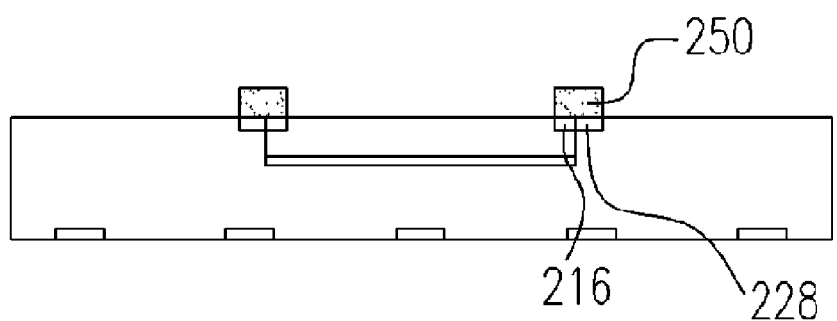
Figure 5:
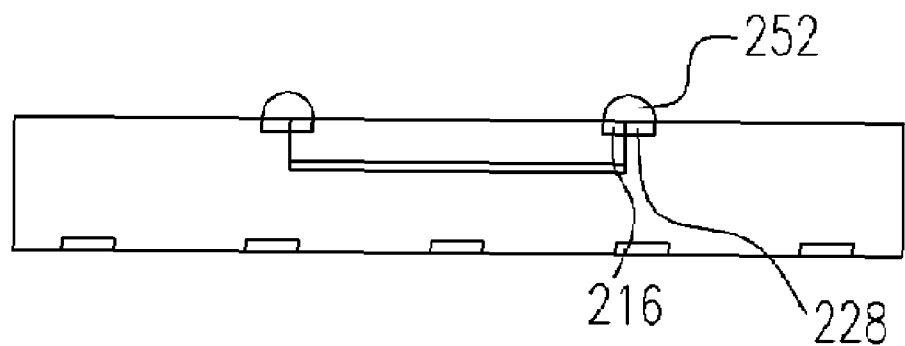

As shown in FIG. 4, a solder material 250 is spread over the chip contact 216 and the substrate contact 228 using a screen-printing method. The solder material 250 is an evenly mixed paste of metallic particles within a flux material (not shown). Thereafter, a reflow process is conducted to melt the metallic particles and consolidate into a conductive trace 252 over the chip contact 216 and the substrate contact 228 as shown in FIG. 5. Through the conductive trace 252, the chip contact 216 and the substrate contact 228 are electrically connected. The material of the conductive trace 252 is, for example, lead-tin alloy, tin, or lead-free conductive material. Alternatively, if the chip contact and the substrate contact can somehow be tightly engaged together while the chip 210 is lowered onto the cavity 226 of the substrate 220 to form a direct electrical connection, the steps for forming the conductive trace can be eliminated. In an alternative embodiment, the conductive trace can be a patch of conductive adhesive. In this case, the conductive adhesive is directly applied to the active surface of the chip contacts and the substrate contacts and then followed by a baking process to dry the conductive adhesive. Hence, there is no need to carry out a reflow process.

Figure 6:
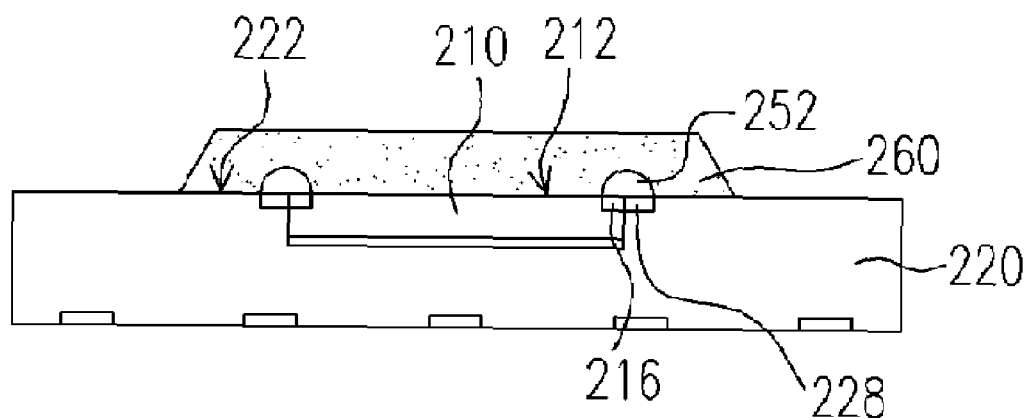
Figure 7:
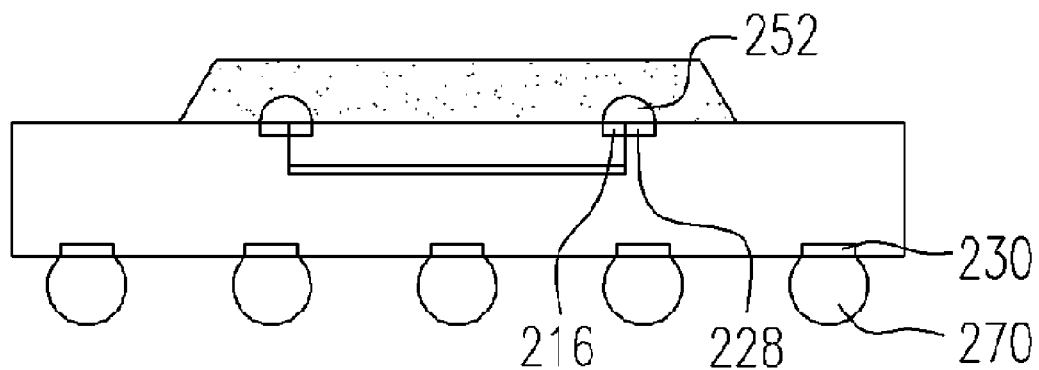

Furthermore, an encapsulation 260 may also be applied to enclose the active surface 212 of the chip 210, the first surface 222 of the substrate 220 and the conductive trace 252 and form the structure as shown in FIG. 6. Thereafter, a ball planting process may be conducted to attach a solder ball 270 to each substrate contact 230 as shown in FIG. 7.

In the aforementioned chip package, the chip contact 216 is connected directly to the substrate contact 228 or through the conductive trace 252. With a shortening of the transmission path between the chip contact 216 and the substrate contact 228 and a widening of the transmission section, transmission impedance and signal decay are reduced. Consequently, the package is suitable for high frequency operation because there is considerable reduction in parasitic inductance and capacitance. Moreover, since the substrate contact 228 and the chip contact 216 are in direct contact or through a conductive trace having a relatively large contact area with both the substrate contact 228 and the chip contact 216, contact resistance is small. Therefore, signal reflection due to impedance mismatch can be prevented. Since superior power/ground sources are provided, overall electrical performance of the package is improved.

Figure 8:
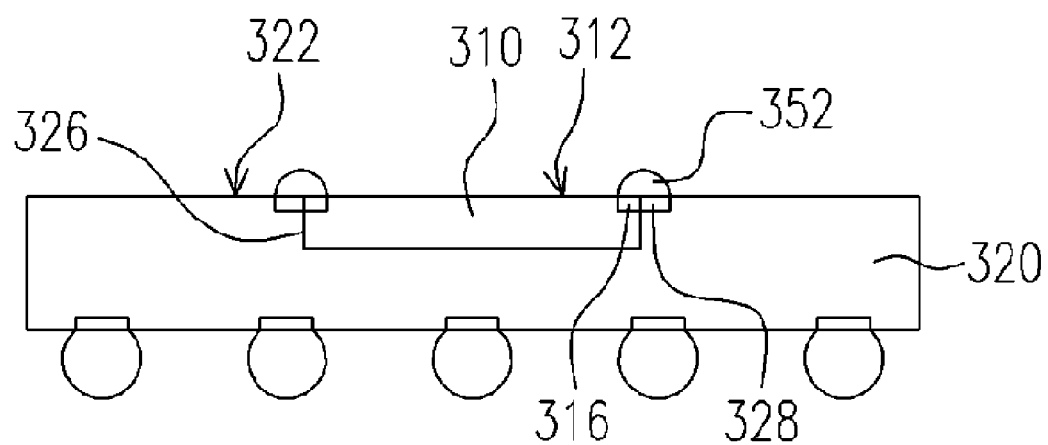
FIG. 8 is a cross-sectional view of a chip package structure according to a second preferred embodiment of this invention.

In an alternative embodiment, the application of the adhesive material to the backside of the chip and the enclosing of the chip, the first surface of the substrate and the conductive trace may be deleted as shown in FIG. 8. FIG. 8 is a cross-sectional view of a chip package structure according to a second preferred embodiment of this invention. The conductive traces 352 not only serve as an electrical bridge connecting the chip contact 316 and the substrate contact 328, the conductive traces 352 also serve as retainers restraining any movement of the chip 310 inside the cavity 326 of the substrate 320. In an ideal situation, the active surface 312 of the chip 310 and the first surface 322 of the substrate 320 are coplanar. The active surface 312 of the chip 320 may be directly exposed and the backside of the chip 310 may be directly in contact with the bottom surface of the cavity 326.

Figure 9:
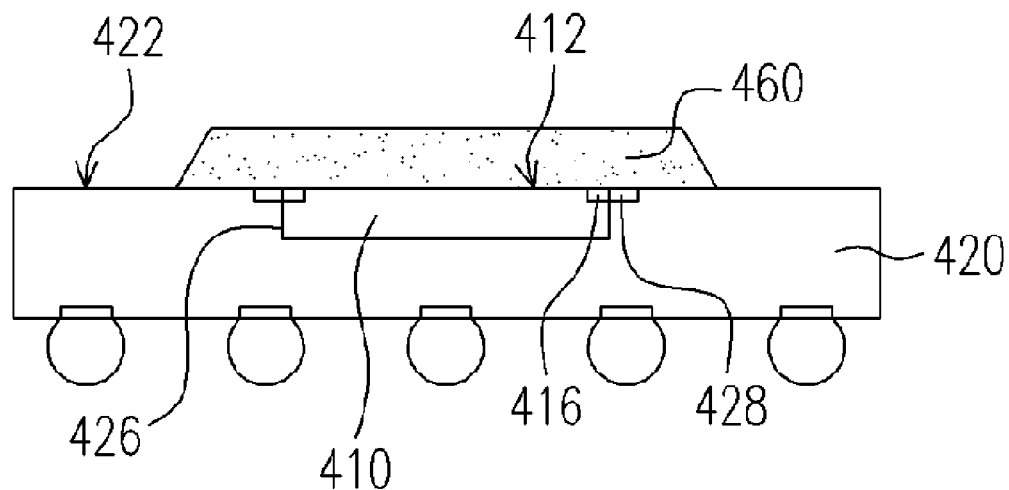
FIG. 9 is a cross-sectional view of a chip package structure according to a third preferred embodiment of this invention.

Even the formation of conductive traces over the substrate contacts and the chip contacts as well as the application of adhesive material to the backside of the chip is unnecessary as shown in FIG. 9. FIG. 9 is a cross-sectional view of a chip package structure according to a third preferred embodiment of this invention. In FIG. 9, an encapsulation 460 is applied over the chip 410 so that the chip 410 is stationed inside the cavity 426 of the substrate 420. However, for this type of package, the chip contact 416 and the substrate contact 428 must be electrically connected directly when the chip 410 is lowered onto the cavity 426. In an ideal situation, the active surface 412 of the chip 410 and the first surface 422 of the substrate 420 are coplanar. The backside of the chip 410 may be directly in contact with the bottom surface of the cavity 426. Since the positioning of the chip contacts 416 and the substrate contacts 428 is similar to the aforementioned embodiments, detailed description is omitted here.

Figure 10:
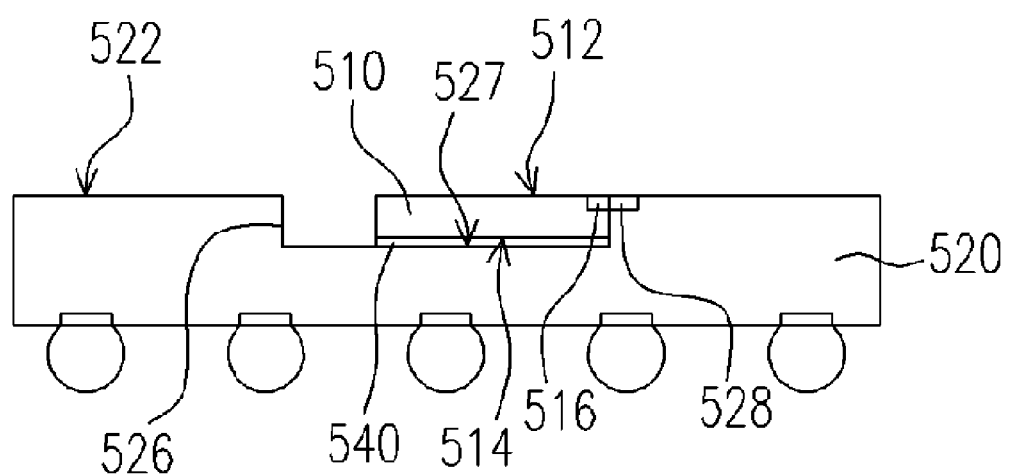
FIG. 10 is a cross-sectional view of a chip package structure according to a fourth preferred embodiment of this invention.

FIG. 10 is a cross-sectional view of a chip package structure according to a fourth preferred embodiment of this invention. As shown in FIG. 10, only one sidewall of the chip 510 is in contact with the sidewall of the cavity 526 on the substrate 520. In other words, this invention has no restriction on the number of chip sidewalls in contact with the cavity sidewalls on the substrate. In an ideal situation, the active surface 512 of the chip 510 and the first surface 522 of the substrate 520 are coplanar. The chip contacts 516 may be positioned on one edge of the chip 510 so that the chip contacts 516 and the substrate contacts 528 on the edge of the cavity 526 are in direct electrical contact. The backside 514 of the chip 510 is attached to the bottom surface 527 of the cavity 526 using an adhesive material 540.

Figure 11:
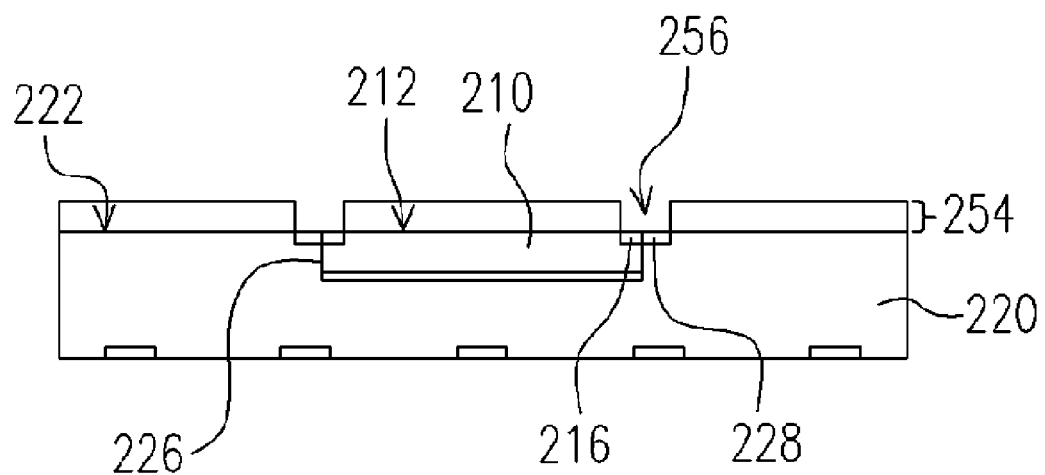
FIGS. 11 to 13 are cross-sectional views showing the progression of steps for fabricating a chip package according to a fifth embodiment of this invention.
Figure 12:
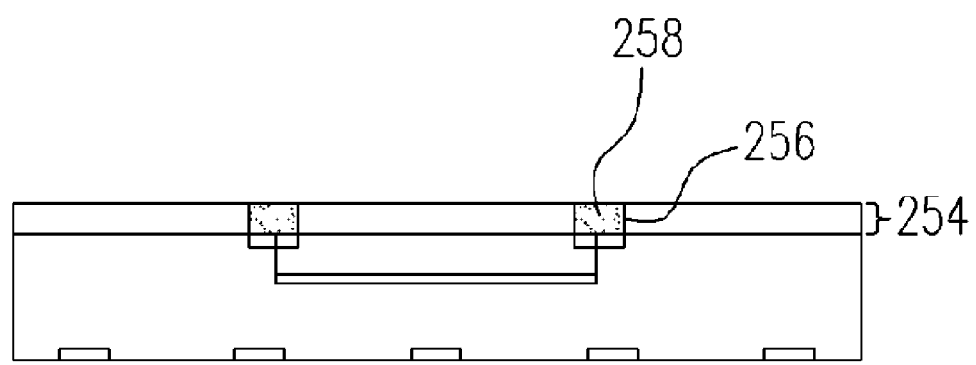
Figure 13:
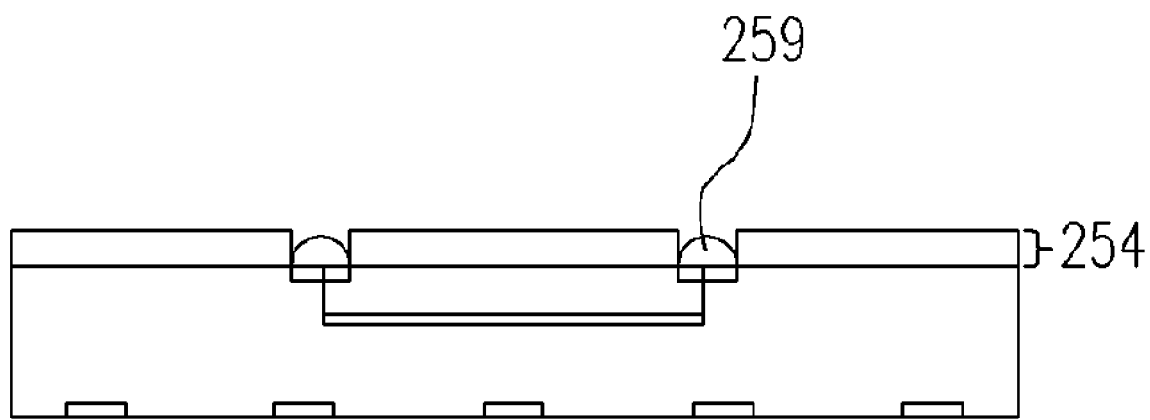

In the first embodiment, the solder material is applied over the chip contacts and the substrate contacts by screen-printing. However, screen-printing is by no means the only method of depositing solder material on the chip and substrate contacts according to this invention. FIGS. 11 to 13 are cross-sectional views showing the progression of steps for fabricating a chip package according to a fifth embodiment of this invention. Since the first embodiment is also referred to in this embodiment, elements in FIGS. 11 to 13 identical to the ones in the first embodiment are labeled identically. After gluing the backside of the chip 210 onto the bottom surface of the cavity 226, a patterned mask 254 is formed on the active surface 212 of the chip 210 and the first surface 222 of the substrate 220. If the patterned mask 254 is made from a photosensitive material, an opening 256 that exposes the chip contact 216 and the substrate contact 228 is formed by photo-exposure and development. On the other hand, if the patterned mask 254 is a non-photosensitive layer, photolithographic and etching processes are carried out to form the opening 256. Thereafter, a printing method is used to deposit solder material 258 into the opening 256 as shown in FIG. 12. The solder material 258 is composed of metallic particles (not shown) evenly mixed within a flux material (not shown). A solder reflow process is carried out to melt the metallic particles into a solid conductive trace 259 over the chip contact 216 and the substrate contact 228 as shown in FIG. 13. Through the conductive trace 252, the chip contact 216 and the substrate contact 228 are electrically connected. The patterned mask 254 is removed. Finally, the remaining steps described in the first embodiment are conducted to form a complete package.

Figure 14:
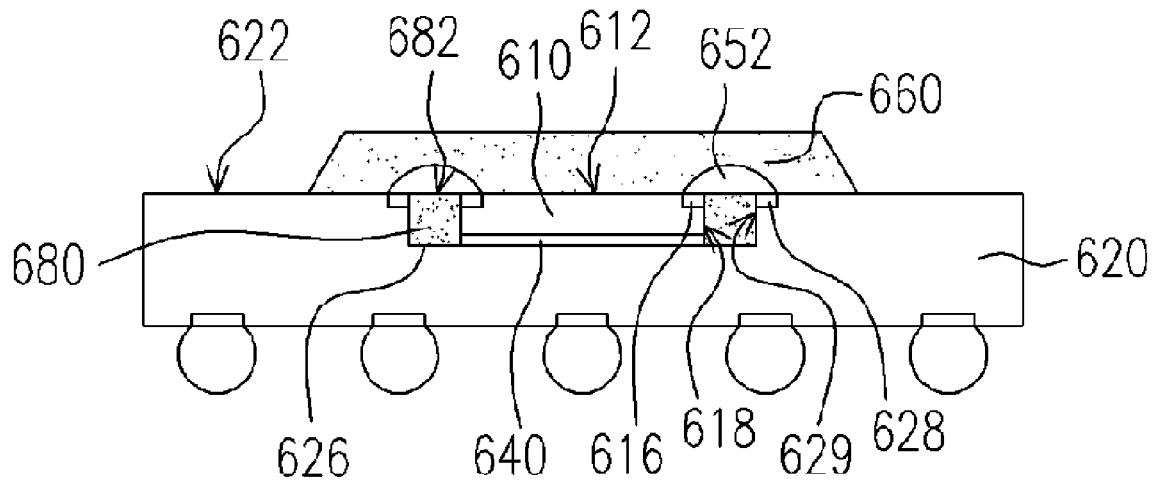
FIG. 14 is a cross-sectional view of a chip package structure according to a sixth preferred embodiment of this invention.

In the above embodiment, the sidewall of the chip is in contact with the sidewall of the cavity such that the chip contacts are in contact with the substrate contacts. However, the present invention is not limited to the above-mentioned statement. FIG. 14 is a cross-sectional view of a chip package structure according to a sixth preferred embodiment of this invention. There is a fill material 680 positioned between the sidewall 618 of the chip 610 and the sidewall 629 of the cavity 626. Preferably, the fill material 680 has a surface 682 coplanar with the active surface 612 of the chip 610 and the surface 622 of the substrate 620. The conductive traces 652 extend from the active surface 612 of the chip 610 to the surface 622 of the substrate 620 across the surface 682 of the fill material 680 and electrically connect the substrate contacts 628 and the chip contacts 616. In the embodiment, the chip contacts 616 are positioned on the border between the active surface 612 and the sidewall 618 of the chip 610. The substrate contacts 628 are positioned on the border between the surface 622 of the substrate 620 and the sidewall 629 of the cavity 626.

The process for fabricating the chip package structure in FIG. 14 is described as follows. After the chip 610 is attached onto the bottom of the cavity 626 using an adhesive material 640, the fill material 680 is dispensed between the sidewall 618 of chip 610 and the sidewall 629 of the cavity 626. Thereafter, conductive traces 652 are formed using the above printing process and then an encapsulation 660 is formed to cover the conductive traces 652, the active surface 612 of the chip 610 and the surface 622 of the substrate 620.

Figure 15:
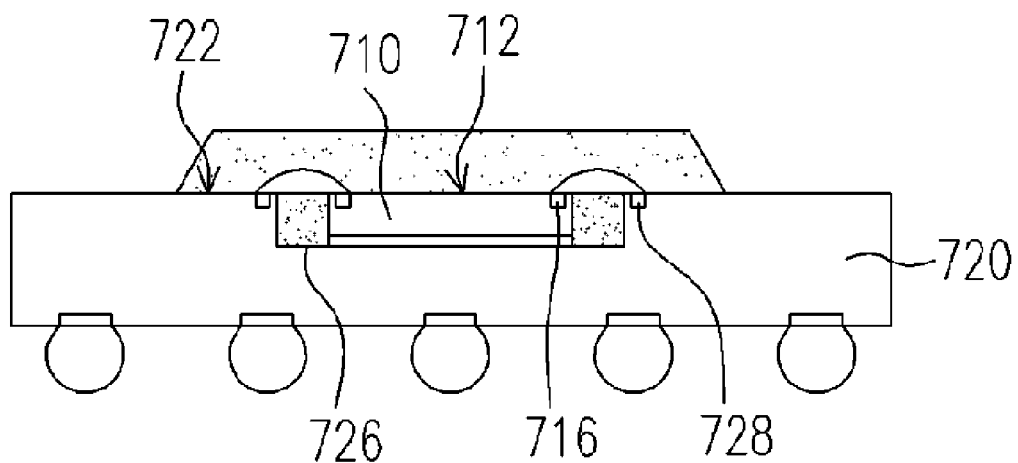
FIG. 15 is a cross-sectional view of a chip package structure according to a seventh preferred embodiment of this invention.

Alternatively, as shown in FIG. 15 that is a cross-sectional view of a chip package structure according to a seventh preferred embodiment of this invention, the chip contacts 716 can be positioned on the active surface 712 of the chip 710 but not on the border of the active surface 712. The substrate contacts 728 are positioned on the surface 722 of the substrate 720 but not on the border of the surface 722. Other elements are similar with those described in the sixth embodiment and the repeat is omitted.

Figure 16:
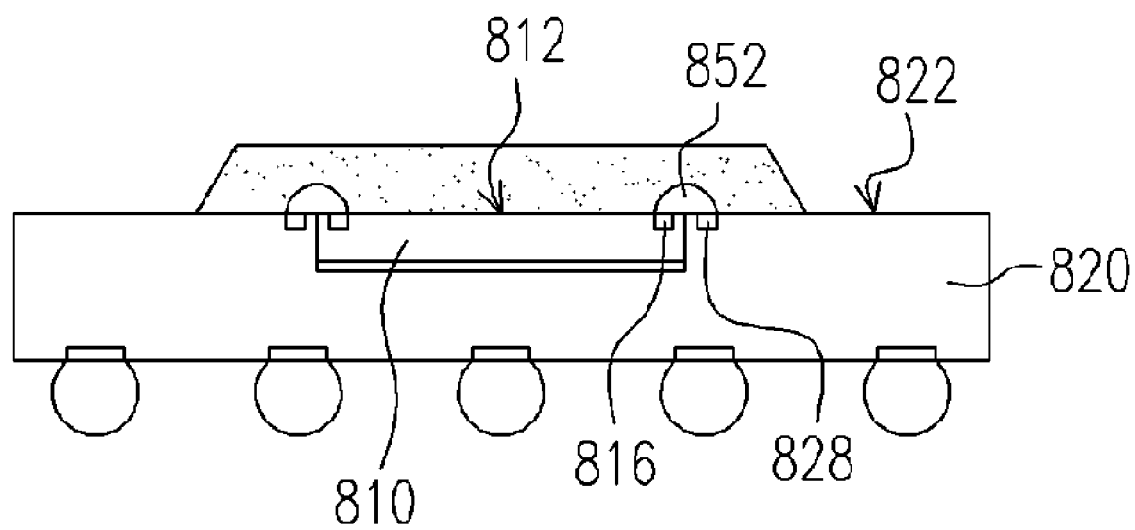
FIG. 16 is a cross-sectional view of a chip package structure according to an eighth preferred embodiment of this invention.

In the first embodiment, the chip contacts are positioned on the border between the active surface and the sidewall of the chip. The substrate contacts are positioned on the border between the surface of the substrate and the sidewall of the cavity. After the chip is lowered into the cavity of the substrate, the chip contacts directly contact the substrate contacts. Alternatively, in practice, the chip contacts 816 can be positioned on the active surface 812 of the chip 810 but not on the border of the active surface 812 and the substrate contacts 828 are positioned on the surface 822 of the substrate 820 but not on the border of the surface 822, as shown in FIG. 16 that is a cross-sectional view of a chip package structure according to a eighth preferred embodiment of this invention. Conductive traces 852 electrically connect the chip contacts 816 with the substrate contacts 828 across the active surface 812 of the chip 810 and the surface 822 of the substrate 820. Other elements are similar with those described in the first embodiment and the repeat is omitted.

In all the aforementioned embodiments of this invention, the substrate serves as a carrier. However, other electronic devices may also serve as a carrier.

In conclusion, major advantages of this invention include:

1. Since the chip contact is connected directly to the substrate contact or through a conductive trace, the transmission path between the chip contact and the substrate contact is shortened and the transmission section is widened. Consequently, transmission impedance and signal decay are reduced. Thus, the package is suitable for high frequency operation because there is considerable reduction in parasitic inductance and capacitance.

2. Since the substrate contact and the chip contact are in direct contact or through a conductive trace having a relatively large contact area with both the substrate contact and the chip contact, impedance mismatch is prevented.

3. Since the chip package is able to provide good power/ground sources, electrical performance of the package is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a conductive bridge connecting a chip and a carrier, comprising the steps of:
   providing a carrier with a cavity, the cavity positioned on a surface of the carrier;
   providing a chip having an active surface;
   allocating the chip into the cavity of the carrier;
   dispensing a fill material between the chip and the cavity, wherein the fill material having a fill-material surface; and
   forming at least one conductive trace that extends on and directly contacts the active surface of the chip, the fill-material surface and the surface of the carrier such that the chip and the carrier are electrically connected, wherein the active surface, the surface of the carrier and the fill-material surface are coplanar.

2. The fabricating method of claim 1, wherein the step of forming the conductive trace includes the sub-steps of:
   depositing a layer of solder material on the active surface of the chip, the fill-material surface and the surface of the carrier by screen-printing, wherein the active surface of the chip, the fill-material surface and the surface of the carrier substantially face the same direction; and
   conducting a solder reflow process to turn the solder material into the conductive trace.

3. The fabricating method of claim 1, wherein the step of forming the conductive trace includes the sub-steps of:
   forming a patterned mask on the active surface of the chip, the fill-material surface and the surface of the carrier, wherein the patterned mask has at least an opening that exposes a portion of the active surface of the chip, a portion of the fill-material surface and a portion of the surface of the carrier;
   depositing solder material into the opening by conducting a printing process;
   conducting a solder reflow process to turn the solder material into the conductive trace; and
   removing the patterned mask.

4. The fabricating method of claim 3, wherein the patterned mask is a photosensitive material.

5. The fabricating method of claim 3, wherein the patterned mask is a non-photosensitive material.

6. The fabricating method of claim 1, wherein carrier includes a substrate.

7. The fabricating method of claim 1, wherein the conductive trace is fabricated using a conductive adhesive.

8. A method of fabricating a conductive bridge connecting a chip and a carrier, at least comprising the steps of:
   providing a carrier having a cavity on one surface, the cavity having a first sidewall, the carrier having at least one carrier contact on the border between the surface of the carrier and the first sidewall;
   providing a chip having an active surface and a second sidewall, wherein the chip has a chip contact on the border between the active surface and the second sidewall; and
   allocating the chip into the cavity of the carrier, wherein the active surface of the chip and the surface of the carrier are coplanar and the first sidewall is in contact with the second sidewall so that the chip contact is in contact with the carrier contact.

9. The fabricating method of claim 8, wherein the carrier is a substrate.

* * * * *